(12) United States Patent
Pavier et al.

(10) Patent No.: US 7,274,100 B2
(45) Date of Patent: Sep. 25, 2007

(54) BATTERY PROTECTION CIRCUIT WITH INTEGRATED PASSIVE COMPONENTS

(75) Inventors: Mark Pavier, Felbridge (GB); Tim Sammon, Helensburgh (GB)

(73) Assignee: International Rectifier Corporation, El Seguno, CA (US)

( * ) Notice: Subject to any disclaimer, the term of this patent is extended or adjusted under 35 U.S.C. 154(b) by 0 days.

(21) Appl. No.: 10/875,473

(22) Filed: Jun. 23, 2004

(65) Prior Publication Data

US 2004/0256738 A1   Dec. 23, 2004

Related U.S. Application Data

(60) Provisional application No. 60/482,232, filed on Jun. 23, 2003.

(51) Int. Cl.
*H01L 23/34* (2006.01)
(52) U.S. Cl. ............. 257/724; 257/924; 257/E25.012

(58) Field of Classification Search ............... 257/724
See application file for complete search history.

(56) References Cited

U.S. PATENT DOCUMENTS

| | | | |
|---|---|---|---|
| 5,144,526 A * | 9/1992 | Vu et al. | 361/321.1 |
| 6,218,729 B1 * | 4/2001 | Zavrel et al. | 257/698 |
| 6,317,023 B1 * | 11/2001 | Felten | 338/254 |
| 6,356,453 B1 * | 3/2002 | Juskey et al. | 361/760 |
| 6,407,929 B1 * | 6/2002 | Hale et al. | 361/763 |
| 2001/0009273 A1 * | 7/2001 | St. John | 252/514 |
| 2001/0038906 A1 * | 11/2001 | O'Bryan et al. | 428/209 |
| 2002/0089318 A1 * | 7/2002 | Armstrong et al. | 323/285 |
| 2002/0096748 A1 * | 7/2002 | Pavier | 257/670 |
| 2002/0180063 A1 * | 12/2002 | Iwaki et al. | 257/778 |

* cited by examiner

Primary Examiner—Evan Pert
Assistant Examiner—Benjamin P. Sandvik
(74) Attorney, Agent, or Firm—Ostrolenk, Faber, Gerb & Soffen, LLP

(57) ABSTRACT

An integrated circuit which includes a circuit board having passive elements embedded in its body.

9 Claims, 3 Drawing Sheets

US 7,274,100 B2

BATTERY PROTECTION CIRCUIT WITH INTEGRATED PASSIVE COMPONENTS

RELATED APPLICATION

This application is based on and claims benefit of U.S. Provisional Application No. 60/482,232, filed on Jun. 23, 2003, entitled Battery Protection Circuit with Integrated Passive Components, to which a claim of priority is hereby made.

FIELD OF THE INVENTION

This invention relates to an integrated circuit, and more particularly to an integrated circuit realized with a circuit board having embedded passives.

BACKGROUND OF THE INVENTION

It is very desirable for portable electronic devices such as cell phones and the like to provide battery protection circuits for the device batteries. These circuits include power MOSFETs, IC gate drivers, battery gas gauge chips, and the like, along with a number of passive components, e.g. resistors, capacitors, diodes, and inductors.

The assembly of these parts on a conventional printed circuit board consumes considerable "real estate" and volume in that typically only one surface of the circuit board can be used for the assembly of the components. Thus, space within the housing of a device (e.g. a cell phone) becomes limited. Limited space also restricts the use of certain desirable components, for example, a larger battery to prolong the use of the device, a highly desirable commercial characteristic. In addition, as functionality increases, the number of components increases. As a result, the efficient use of space within the housing of the device becomes ever more important.

BRIEF SUMMARY OF THE INVENTION

In accordance with the invention, the printed circuit board which carries the active devices such as the MOSFETs, and the control IC for controlling the devices includes passive elements embedded in the body thereof, and interconnections to the surface mounted devices and the embedded passives is made by suitable conductive vias and the like. Thus, an integrated circuit according to the present invention saves space and is particularly suitable for applications in portable devices in which space conservation and efficiency is important.

DETAILED DESCRIPTION OF EMBODIMENTS OF THE INVENTION

Figure 1:
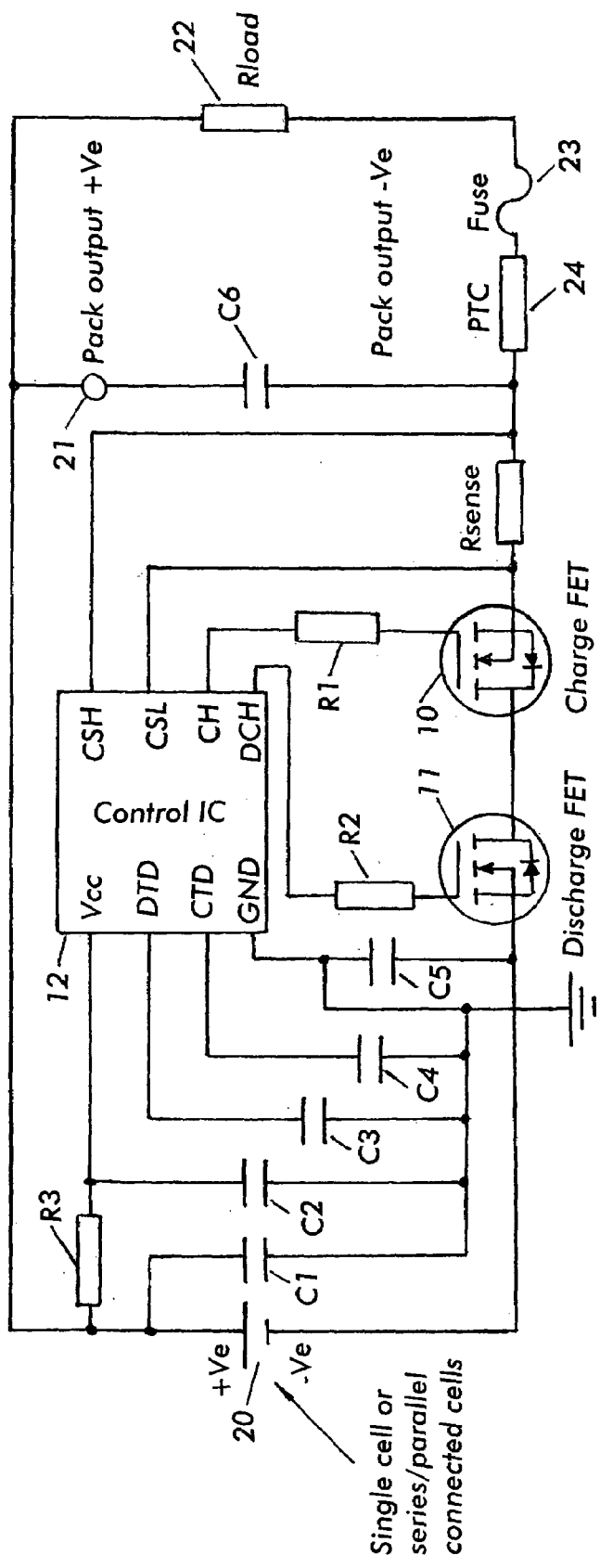
FIG. 1 is a circuit diagram of an N channel MOSFET battery cell protection circuit.

Referring to FIG. 1, a typical battery protection circuit includes an N channel charge MOSFET 10 and an N channel discharge MOSFET 11, which are electrically connected in a common drain configuration to define a bidirectional MOSFET CSP. A control IC 12 drives the gates of MOSFETs 10 and 11 through resistors R1 and R2. The other pins of control IC 12 are connected as shown to passive capacitors C1 to C5, and resistors R3 and Rsense (a circuit sense resistor).

Battery 20, which is protected by the circuit, may be a single cell or a combination of series and parallel connected cells. The positive terminal +Ve of battery 20 is connected to the output terminal 21 of the battery pack. A capacitor C6 is also connected across load 22, while fuse 23 and positive temperature coefficient (PTC) 24 are in series with load 22.

The following are the passive elements in the circuit shown by FIG. 1:

R1, which is used to limit gate slew rate of charge FET 10;
R2, which is used to limit gate slew rate of discharge MOSFET 11;
R3, which is used in conjunction with capacitor C2 to filter out noise into the Vcc of control IC 12;
Rsense, which is a current resistor for gas gauging, if required;
PTC; which is used to protect battery 20 in the event of failure of control IC 12 or MOSFETs 11, 10 where hard short conditions or overcharge current conditions occur;
C1, which is used to reduce the ripple across battery 20 caused by the stray inductance and high di/dt conditions that may occur when the battery pack is first connected to load 22 or when a short circuit condition is detected causing discharge MOSFET 11 to turn off;
C2, which is used in conjunction with resistor R3 as both a hold up capacitor and noise filter to prevent the loss of voltage to control IC 12 during 'hard short' conditions across battery pack;
C3, which is used to set the discharge control time delay for control IC 12, which is the delay between initial detection of a short circuit condition to prevent further current flow between battery 20 and pack output;
C4, which is used to set the overcharge control time delay or 'dead time' between the instant an overcharge condition is detected and when charge MOSFET 10 is turned off (Once the charge control FET is off there is no significant current flow between pack input and battery 20. No further charging takes place).
C5, which is a decoupling capacitor to limit stray ground noise entering the GND pin of control IC 12;
C6, which is an optional decoupling capacitor across load 22;
Fuse, which permanently disconnects battery 20 from load 22 if short circuit current or overcharge current is applied over an extended duration of time, when, for example, the wrong charger is used, or if MOSFET 11 or MOSFET 10 has been damaged by ESD or the like.

Figure 2:
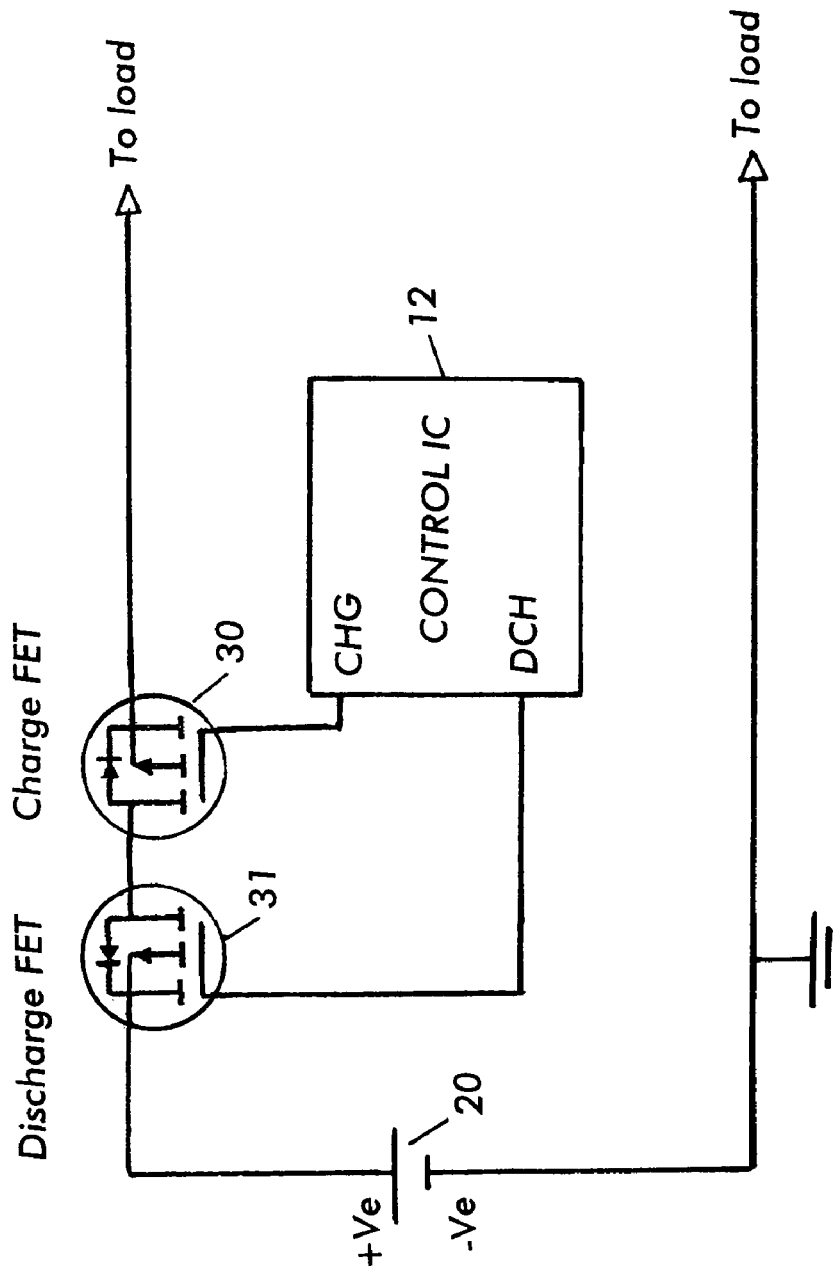
FIG. 2 is a circuit similar to FIG. 1 but for P channel MOSFETs (passives not shown).

In an alternative circuit, P channel MOSFETs may be used instead of N channel MOSFETs 10, 11 when, for example, control of current flow is on the +ve rail (as opposed to the negative rail show in FIG. 1). This type of circuit is shown in FIG. 2 with P channel MOSFETs 30 and 31 (passives excluded). The circuit is otherwise similar to that of FIG. 1.

In both +ve rail switching and −ve rail switching the charge and discharge control MOSFETs are connected in common drain configuration.

Note the circuits shown are for single cell protection circuits that are used in cell phones, personal digital assistants (PDAs) etc. Similar circuits are used for batteries where individual cells are connected in different series or parallel configurations.

Figure 3:
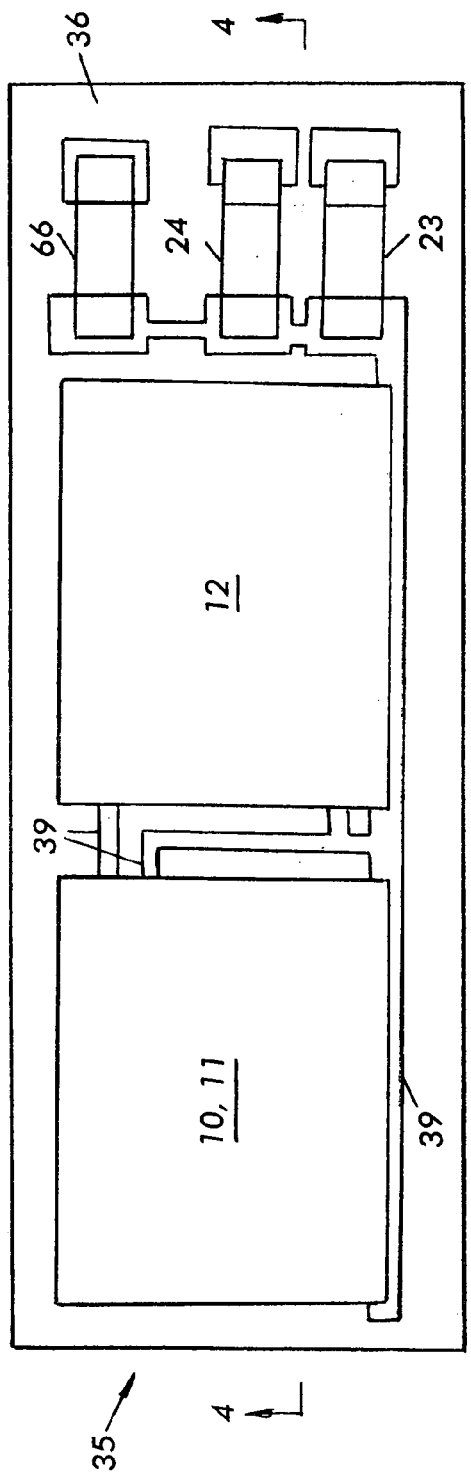
FIG. 3 is a top view of an integrated circuit on a circuit board according to the present invention.
Figure 4:
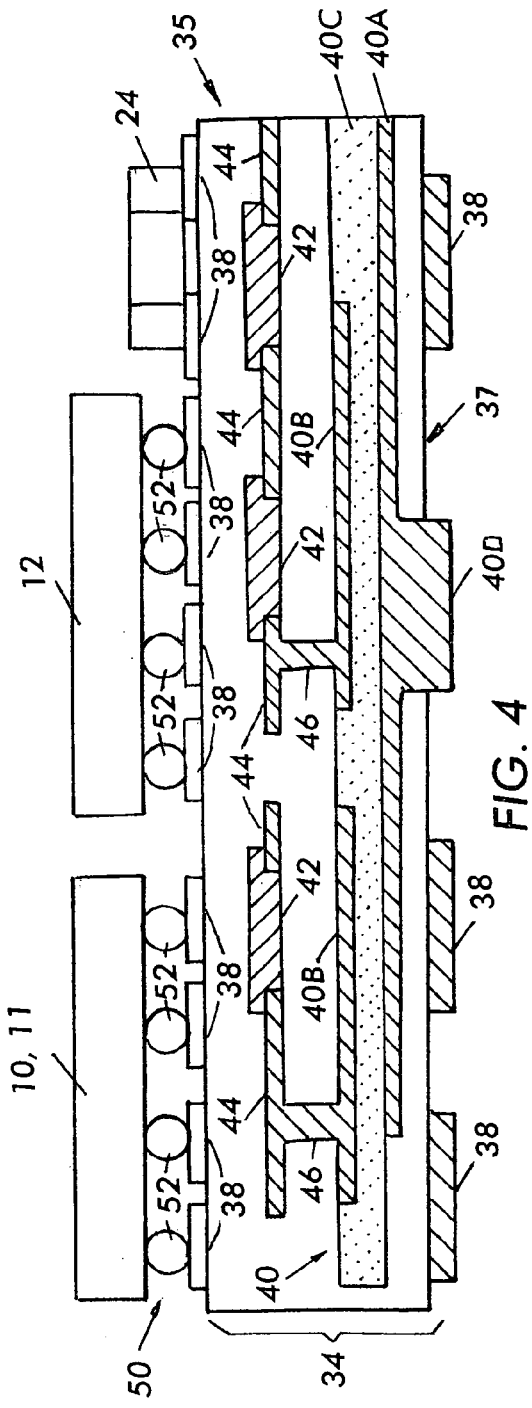
FIG. 4 is a cross-sectional view of FIG. 3 taken across section line 4-4 in FIG. 3 viewed in the direction of the arrows.

Referring now to FIGS. 3, and 4, according to one aspect of the present invention, a circuit, such as the one shown in FIG. 1 or FIG. 2, can be realized as an integrated circuit using a circuit board which includes in its body at least some of the required passive elements. Specifically, body 34 of circuit board 35 according to the present invention includes first surface 36 and second surface 37. Disposed on first surface 36 and second surface 37 are contact pads 38 for providing platforms for electrical connection external to circuit board 35. Thus, contact pads 38 on first surface 36 may receive package 50 containing discharge MOSFET 11 and charge MOSFET 10, which is electrically connected to contact pads 38 preferably by ball contacts 52, and control IC 12 which is also electrically connected to respective pads 38 in a similar manner. Control IC 12 may be, for example, a Gas Gauge Battery Protection type IC. Furthermore, large passive elements such as high value capacitors may also be disposed external to circuit board 35. For example, capacitor C6, PTC 24 and fuse 23 may electrically connected to respective conductive pads 38 on first surface 36. In the embodiment shown by FIG. 3 and FIG. 4, conductive pads 38 on second surface 37 may be used to connect other components external to circuit board 35 such as load 22 and battery 20.

Contact pads 38 are preferably formed from a conductive material such as copper or the like using a conventional method, such as a method for forming conductive pads on an open surface of a circuit board. Conductive tracks 39 may be used to interconnect conductive pads 38. Conductive tracks 39 may be comprised of the same material as that used for conductive pads 38, and formed on a surface of circuit board 35 using a conventional method for forming conductive tracks on a circuit board.

According to the present invention passive elements may be embedded within body 34 of circuit board 35. Thus, capacitors 40 and/or resistors 42 may be formed in body 34 of circuit board 35, and preferably encapsulated by body 34. That is, preferably, the material forming body 34 of circuit board 35 surrounds the passive elements rendering the same embedded. A suitable material for forming body 34 may be, for example, a conventional polymer for forming the body of a circuit board.

According to an aspect of the present invention, resistors 42 may be formed from an epoxy material loaded with metal particles such as particles of iron or copper. Although not shown and specifically described herein other passive elements such as inductors may be formed within body 34 of circuit board 35 using the epoxy and metal combination also.

Resistors 42 may be interconnected within body 34 of circuit board 35 with internal interconnectors 44. Internal interconnectors 44 may be interconnected with conductive pads 38 through vias. Interconnectors 44 may be formed from a conductive material such as copper or the like.

In addition, capacitors 40 may be formed to include a first conductive plate 40A, and a second conductive plate 40B. First conductive plate 40A is electrically isolated from a corresponding second conductive plate 40B by a dielectric body 40C. Dielectric body 40C may formed from a suitable high K material such as Barium Titanate.

In the embodiment illustrated by FIG. 4, first conductive plate 40A includes portion 40D which extends through body 34 of circuit board 35 beyond second surface 37. Preferably, portion 40D is made coplanar with conductive pads 38 on second surface 37 to facilitate proper mounting of the integrated circuit.

Further, in the embodiment illustrated by FIGS. 3 and 4 two capacitors 40 are shown embedded in body 34 of circuit board 35, which capacitors 40 share a common first conductive plate 40A. It should be noted that capacitors 40 formed in body 34 of circuit board 35 are not limited to using a common conductive plate (e.g. first conductive plate 40A), but may be formed to include independent first and second conductive plates.

In addition, in the embodiment shown, resistors 42 are formed between capacitors 40 and first surface 36 of body 34 of circuit board 35, and electrically connected to capacitors 40 by vertical interconnects 46. Vertical interconnects 46 are formed from a conductive material such as copper and extend down to second conductive plates 40B through vias formed in body 34 of circuit board 35.

In a preferred embodiment of the present invention components for forming an integrated circuit for battery protection and monitoring are assembled using a circuit board 35 according to the present invention, and assembled preferably with the battery pack. The integrated circuit may thus include:

Battery protection IC 12 (cell supervisory IC), preferably in CSP;

Bi-directional power MOSFET package 50 for MOSFETs 10, 11 (e.g. flip chip device and/or trench technology, preferably in low footprint CSP packages);

Necessary passives for the device to operate (e.g. capacitors C1 to C5, resistors R1, R2, R3 and $R_{SENSE}$, fuse 23, inductors (not shown) and temperature sense element (not shown)), as may be required by the specific design. Advantageously, by incorporating the passive elements within body 34 of circuit board 35, the integrated circuit will occupy less space, thus enabling more space in the battery pack for, for example, energy storage (i.e. larger battery).

The embedded passives may be manufactured using screen printable dielectrics, resistors and if necessary high permeability ferro-electric pastes. Buried and filled vias and plated trenches may be utilized to interconnect the passive elements and reduce track resistance contributions. Thus, for example, conductive pads 38 may be connected to passive elements in body 34 of circuit board 35 through vertical interconnects such as interconnects 44, in order to realize the desired circuit configuration, such as the one shown by FIG. 1. The vertical interconnects may be formed to extend through respective vias.

A device according to the preferred embodiment of the present invention can have inputs to −ve and +ve terminals of a battery, or connections to combinations of battery cells in series or parallel. For example, conductive pads 38 may be provided on surfaces 36 and 37 for connection to a battery.

The output of an integrated circuit according to the present invention may include fuel gauge diagnostics (i.e. charge status), +ve and −ve outputs and, where necessary, separate earth connection, or any other desirable output signal. An integrated circuit according to the preferred embodiment of the present invention can be used in connection with any battery pack requiring a supervisory circuit including a Li-ion and Lithium polymer ion battery packs which are used in cell phones or PDAs.

It should be noted that other materials may be used for forming the passive elements in a device according to the present invention. For example, the resistors may be made from an epoxy loaded with a semiconductor material such as carbon for high values of resistance (1 kOhm or above) or silver or another metal particle for low values of resistance (<100 Ohms). The inductors, for example, may be made from an epoxy having particles of a high permeability material (e.g. iron) dispersed therein.

Furthermore, in addition to epoxy based dielectrics and resistive pastes, fired ceramic dielectrics and resistive pastes may be used in forming the passives.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An integrated circuit comprising:
    a battery assembled with a circuit board having a body, said body including a first surface and a second surface opposing said first surface;
    a plurality of first conductive pads on said first surface of said body;
    a discharge power semiconductor switch electrically and mechanically connected to one set of said first conductive pads;
    a charge power semiconductor switch electrically and mechanically connected to another set of said first conductive pads;
    a battery protection integrated circuit disposed on said first surface and operatively connected to said discharge power semiconductor switch and said charge power semiconductor switch;
    a plurality of second conductive pads on said second surface of said body for electrical connection to a load;
    another plurality of second conductive pads on said second surface of said body for electrical connection to said battery; and
    at least one capacitor disposed within said body and including at least one terminal extending through said body and exposed through said second surface of said body; wherein said capacitor includes two spaced plates insulated by a dielectric body from another plate, said another plate including said at least one terminal.

2. The integrated circuit of claim 1, further comprising a plurality of passives contained within said body.

3. The integrated circuit of claim 2, wherein at least one of said plurality of passives is a resistor.

4. The integrated circuit of claim 2, wherein said plurality of passives are comprised of epoxy loaded with particles.

5. The integrated circuit of claim 4, wherein said particles are comprised of a material with high magnetic permeability.

6. The integrated circuit of claim 4, wherein said particles are comprised of a semi-conducting material.

7. The integrated circuit of claim 4, wherein said particles are comprised of an electrically conducting material.

8. The integrated circuit of claim 2, wherein said plurality of passives are comprised of a fired resistive paste.

9. The integrated circuit of claim 2, wherein said plurality of passives are comprised of a fired high permeability paste.

* * * * *